US007714391B2

(12) United States Patent
Kim et al.

(10) Patent No.: US 7,714,391 B2
(45) Date of Patent: May 11, 2010

(54) THIN FILM TRANSISTOR AND METHOD FOR FABRICATING THE SAME

(75) Inventors: Hoon Kim, Seoul (KR); Ki-Yong Lee, Yongin-si (KR); Jin-Wook Seo, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 10/989,663

(22) Filed: Nov. 17, 2004

(65) Prior Publication Data

US 2005/0110089 A1 May 26, 2005

(30) Foreign Application Priority Data

Nov. 22, 2003 (KR) .................. 10-2003-0083384

(51) Int. Cl.
*H01L 23/62* (2006.01)
(52) U.S. Cl. .............................. 257/368; 257/E21.04
(58) Field of Classification Search .............. 257/51, 257/347, 353, 368, E21.04
See application file for complete search history.

(56) References Cited

U.S. PATENT DOCUMENTS

| 5,061,864 | A | * | 10/1991 | Rogers | 326/17 |
| 6,479,333 | B1 | * | 11/2002 | Takano et al. | 438/159 |
| 6,596,573 | B2 | * | 7/2003 | Lee et al. | 438/166 |
| 7,078,321 | B2 | * | 7/2006 | Yoshimoto | 438/486 |
| 2001/0005020 | A1 | * | 6/2001 | Jinno et al. | 257/59 |
| 2003/0111691 | A1 | * | 6/2003 | So | 257/347 |
| 2004/0166655 | A1 | | 8/2004 | Wong | |

FOREIGN PATENT DOCUMENTS

| CN | 1431711 | 7/2003 |
| JP | 2001-326176 | 11/2001 |
| JP | 2002-025907 | 1/2002 |
| JP | 2002-299348 | 10/2002 |
| JP | 2002-329667 | 11/2002 |
| JP | 2003-203928 | 7/2003 |
| JP | 2005159305 | 6/2005 |
| KR | 10-1999-0039331 | 6/1999 |
| KR | 1999-0039331 | 6/1999 |
| KR | 10-2002-0036926 | 5/2002 |
| KR | 1020020033373 | 5/2002 |
| KR | 10-2002-0063093 | 8/2002 |

* cited by examiner

*Primary Examiner*—Bradley K Smith
*Assistant Examiner*—Amar Movva
(74) *Attorney, Agent, or Firm*—H.C. Park & Associates, PLC

(57) ABSTRACT

A thin film transistor formed by using a metal induced lateral crystallization process and a method for fabricating the same. The thin film transistor comprises an insulating substrate, an active layer formed of polycrystalline silicon and having source/drain regions and a channel region, and a gate electrode formed on a gate insulating layer. The active layer has at least two metal induced lateral crystallization (MILC) regions.

25 Claims, 21 Drawing Sheets

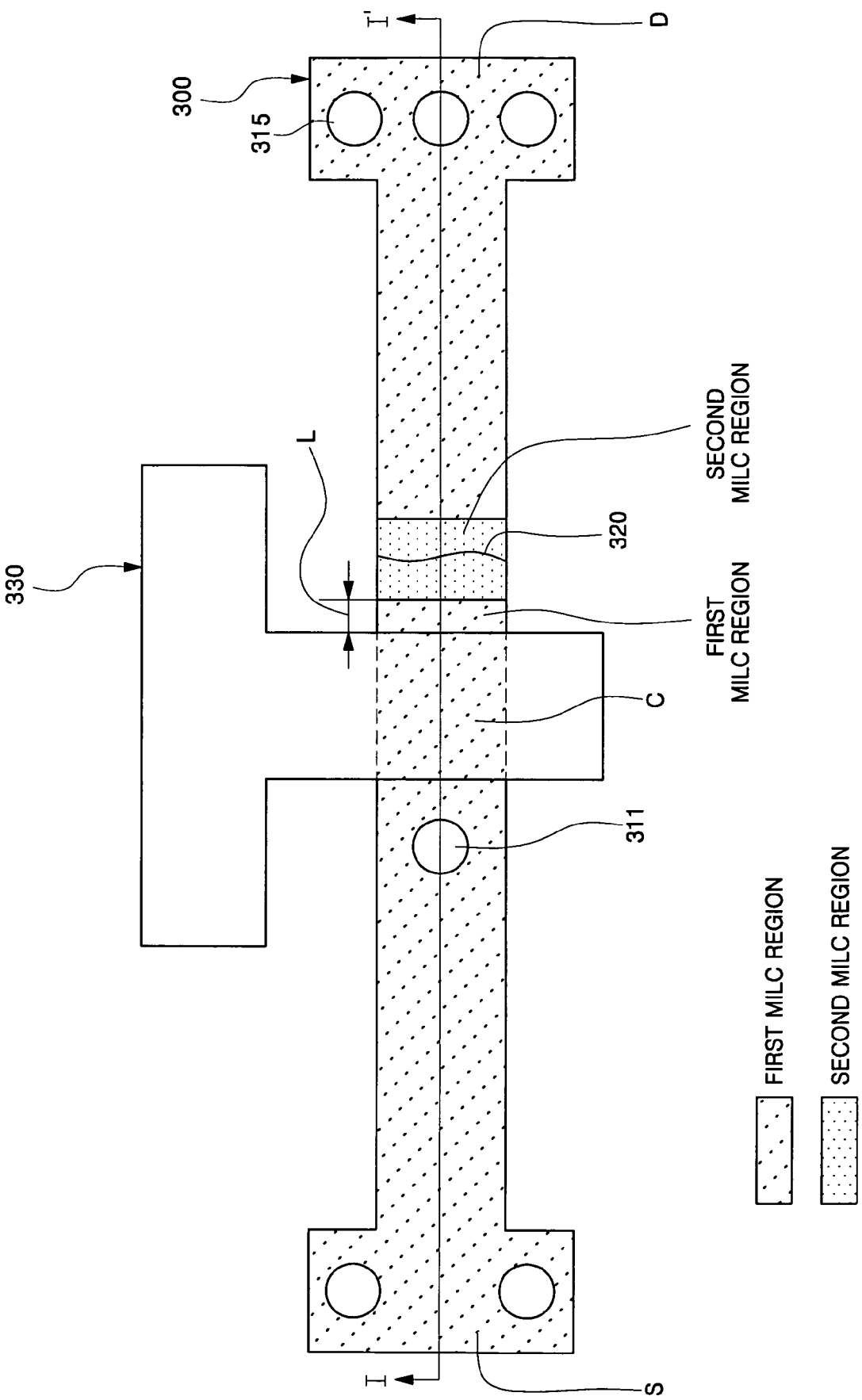

FIG. 5A
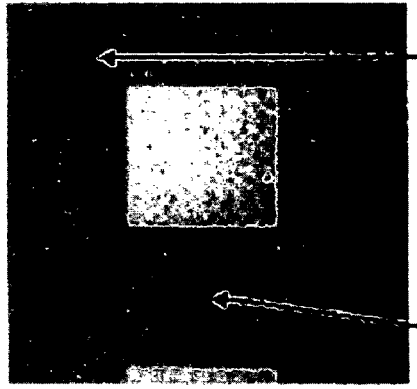
Furnace 550oC, 6hr
GRAIN IS LARGELY GROWN
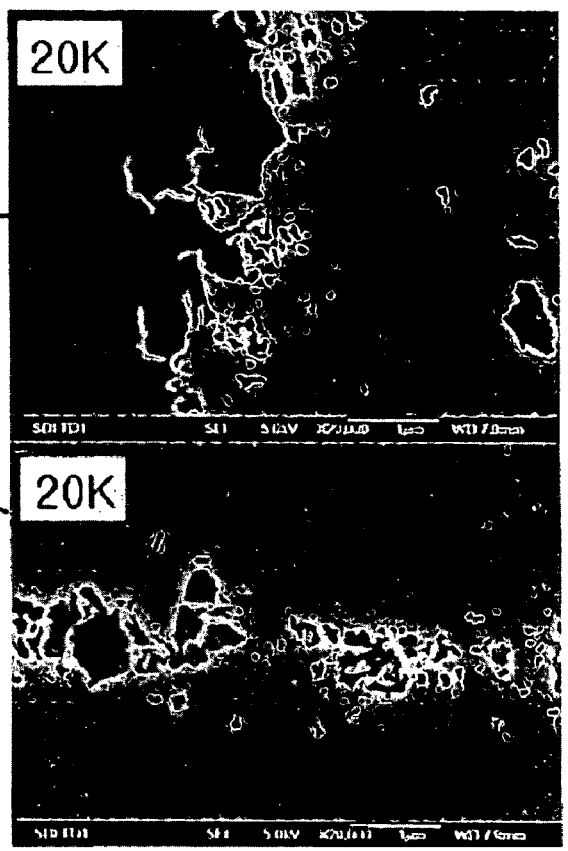

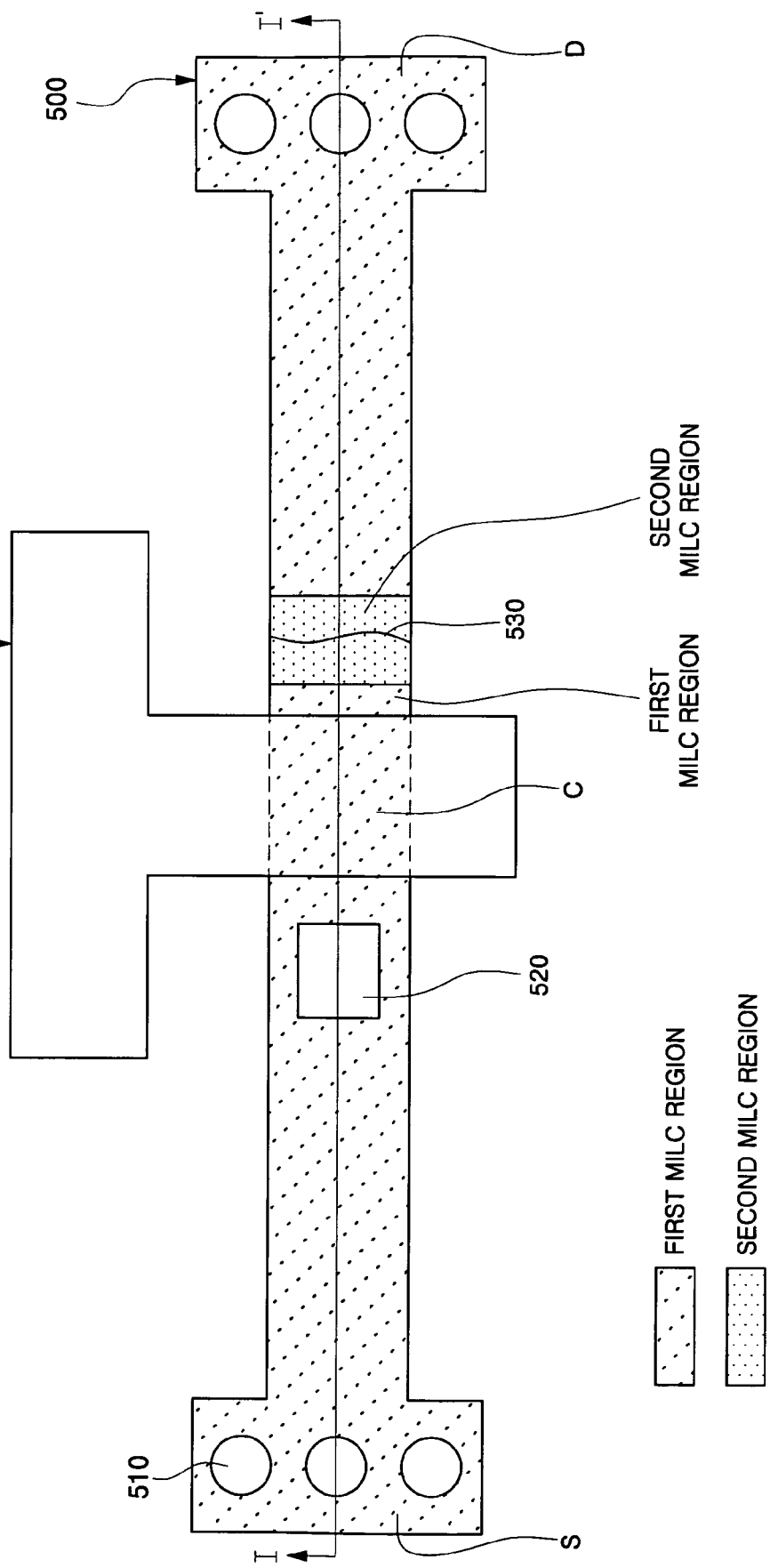

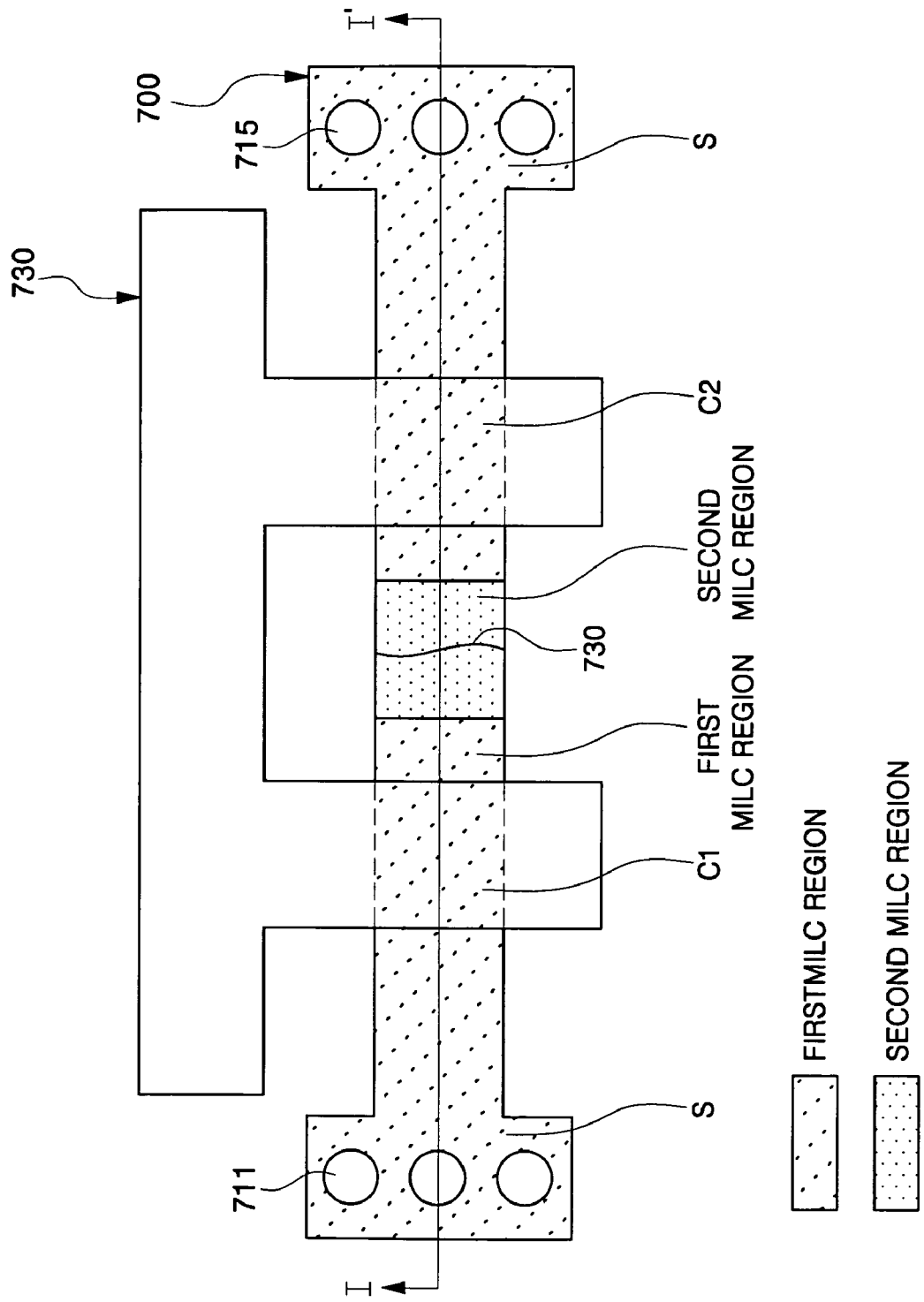

THIN FILM TRANSISTOR AND METHOD FOR FABRICATING THE SAME

CROSS-REFERENCE TO RELATED APPLICATION

This application claims the benefit of Korean Patent Application No. 10-2003-0083384, filed Nov. 22, 2003, which is hereby incorporated by reference for all purposes as if fully set forth herein.

BACKGROUND OF THE INVENTION

1. Field of the Invention

The present invention relates to a thin film transistor (TFT) and method for fabricating the same and, more particularly, to a TFT formed by a Metal Induced Lateral Crystallization (MILC) process and method for fabricating the same.

2. Discussion of the Related Art

A polycrystalline silicon layer, which may be used for an active layer of a TFT, may be formed by depositing an amorphous silicon layer on an insulating substrate, and then crystallizing the layer using heat.

Solid Phase Crystallization (SPC) by means of thermal treatment, Eximer Laser Annealing (ELA) by means of laser crystallization, and Metal Induced Lateral Crystallization (MILC), or other like methods may be employed to crystallize the amorphous silicon layer.

The SPC method requires a high temperature for the crystallization, and the ELA method requires high-priced equipment, laser instability may produce temporal and spatial unevenness in the polycrystalline silicon, and the laser may cause striped defects.

On the other hand, with the MILC process, conventional thermal treatment equipment may be employed to perform crystallization at a relatively low processing temperature, and a laser is not required, which avoids laser-induced striped defects.

FIG. 1 is a plan view of a conventional TFT, which is limited to show an active layer 110 and a gate electrode 330 thereof.

The TFT shown in FIG. 1 comprises an active layer 110 having source/drain regions S and D and a channel region C, a gate electrode 140, and a contact hole 120 for exposing some portions of the source/drain regions S and D of the active layer 110. The active layer 100 is crystallized by an MILC process, and an MILC surface 130 may be formed at the center of the channel region C.

FIG. 2A, FIG. 2b, FIG. 2C and FIG. 2D show cross-sectional views, taken along the I-I' line of FIG. 1, for explaining a method for fabricating the conventional TFT.

Referring to FIG. 2A, amorphous silicon is deposited on an insulating substrate 200 having a buffer layer 210, and it is patterned to form an active layer 220.

A gate insulating layer 230 and a gate electrode material are then sequentially formed on the substrate, and the gate electrode material is patterned to form a gate electrode 240.

Next, impurities are implanted in the active layer 220 using the gate electrode 240 as a mask to form source/drain regions 221 and 225. A region between the source/drain regions 221 and 225 acts as a channel region 223.

Referring to FIG. 2B, an interlayer insulating layer 250 is then deposited on the substrate, and contact holes 251 and 255 are formed to expose a portion of the source/drain regions 221 and 225.

A crystallization inducing metal layer 260, which may be formed of nickel (Ni), is then deposited on the substrate by means of sputtering or other similar methods.

Referring to FIG. 2C, the amorphous silicon layer of the active layer 220 may be heat treated in a furnace to form a polycrystalline silicon layer. The crystallization may be performed at a temperature of 550° C. and at a speed of 3 μm/hr.

In this case, the amorphous silicon of lower regions 221a and 225a is crystallized by the metal induced crystallization (MIC) process, and the remaining amorphous silicon regions 221b and 225b are crystallized by the MILC process.

Referring to FIG. 2D, the crystallization inducing metal layer 260 is then removed, and source/drain electrodes 271 and 275 are formed to form a TFT.

However, the channel region's electrical characteristics may affect the TFT's electrical characteristics. In the TFT formed as described above, an MILC surface, where crystals meet due to the MILC process, is formed within the channel region 223, and it may block a charge transfer, which will adversely affect the TFT's electrical characteristics.

Furthermore, in the heat treating process used to crystallize the active layer, the thermal treatment may take a long time at a constant temperature.

SUMMARY OF THE INVENTION

The present invention provides a TFT and a method for fabricating the same, which employs a two-stage MILC process, forms an MILC surface in a region outside the channel region, and has a reduced process time.

Additional features of the invention will be set forth in the description which follows, and in part will be apparent from the description, or may be learned by practice of the invention.

The present invention discloses a TFT comprising an insulating substrate; an active layer formed of polycrystalline silicon and having source/drain regions and at least one channel region and a gate electrode. The active layer has at least two MILC regions.

The present invention also discloses a TFT comprising an active layer having source/drain regions, a channel region, a first MILC region, a second MILC region, and a gate electrode. Portions of the source/drain regions are exposed by contact holes, and a distance from a contact hole of the source region to the channel region is different from a distance from a contact hole of the drain region to the channel region. The first and second MILC regions have different grain sizes different from each other.

The present invention also discloses a TFT comprising an active layer crystallized by an MILC process and having source/drain regions and a channel region, and a gate electrode. The source/drain electrodes are coupled to the source/drain regions through contact holes. A crystallization inducing pattern exposes a portion of the active layer in the source region or the drain region, wherein the crystallization inducing pattern does not electrically connect the source region to the source electrode or the drain region to the drain electrode. The active layer has a first MILC region and a second MILC region, and a grain size of the first MILC region is different from a grain size of the second MILC region.

The present invention also discloses a TFT comprising an active layer crystallized by an MILC process and having source/drain regions and a channel region, and a dual gate electrode. Some portions of the source/drain regions are exposed by contact holes, and the active layer has a first MILC region and a second MILC region, which have different grain sizes different from each other.

The present invention also discloses a TFT having an active layer having source/drain regions and a channel region, and having a first MILC region and a second MILC region; and a dual gate electrode. Source/drain electrodes are coupled to the source/drain regions through contact holes. A crystallization inducing pattern exposing a portion of the active layer between the first contact hole or the second contact hole and the channel region. The crystallization inducing pattern does not electrically connect the source region to the source electrode or the drain region to the drain electrode. A grain size of the first MILC region is different from a grain size of the second MILC region.

The present invention also discloses a method for fabricating a TFT, comprising forming an active layer having source/drain regions and at least one channel region, forming a gate electrode, and crystallizing the active layer. The crystallization is performed through at least two MILC stages.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 3 is a plan view showing a TFT in accordance with a first exemplary embodiment of the present invention.

FIG. 5A and FIG. 5B show scanning electron microscope (SEM) views of a TFT formed by using an MILC process in accordance with a first exemplary embodiment of the present invention.

FIG. 6 is a plan view showing a TFT in accordance with a second exemplary embodiment of the present invention.

FIG. 8A and FIG. 8B are plan views showing a TFT in accordance with a third exemplary embodiment of the present invention.

DETAILED DESCRIPTION OF THE ILLUSTRATED EMBODIMENTS

Figure 1:
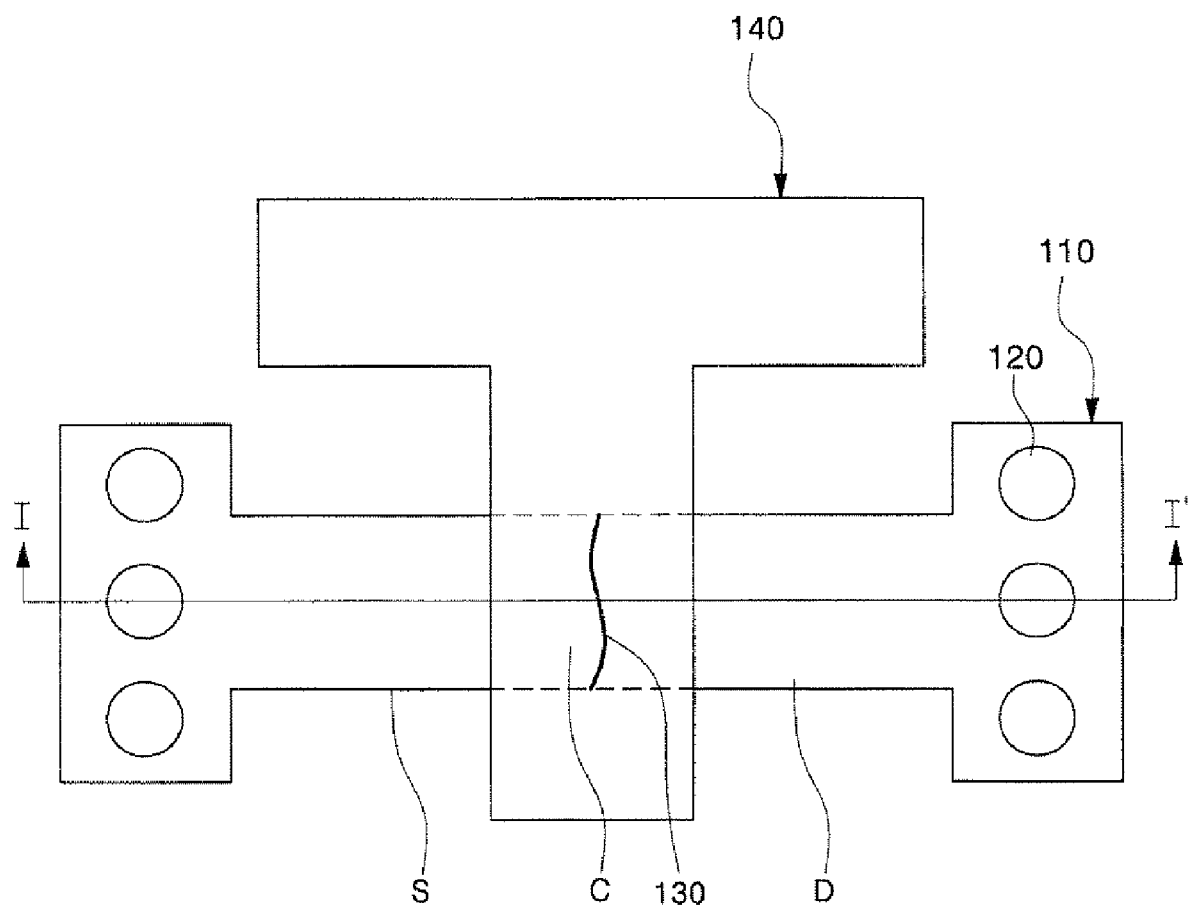
FIG. 1 is a plan view showing a conventional TFT.
Figure 2A:
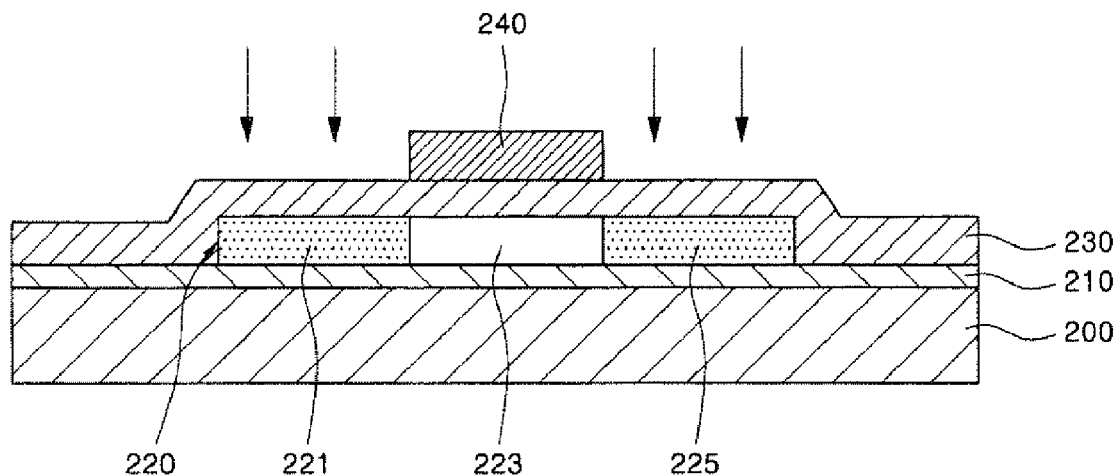
FIG. 2A, FIG. 2B, FIG. 2C and FIG. 2D are cross-sectional views showing a method for fabricating a conventional TFT.
Figure 2B:
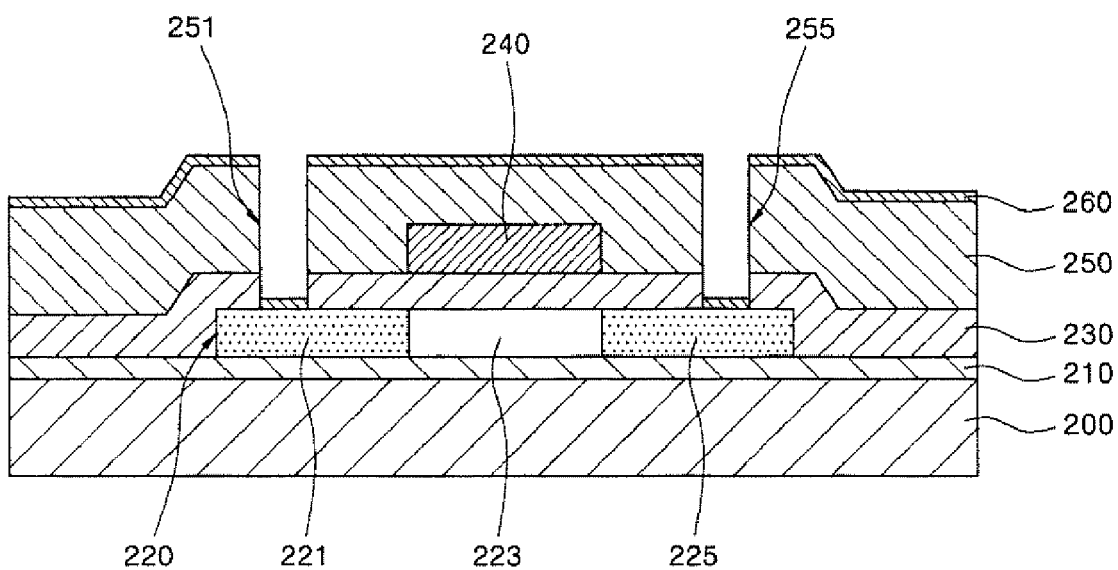
Figure 2C:
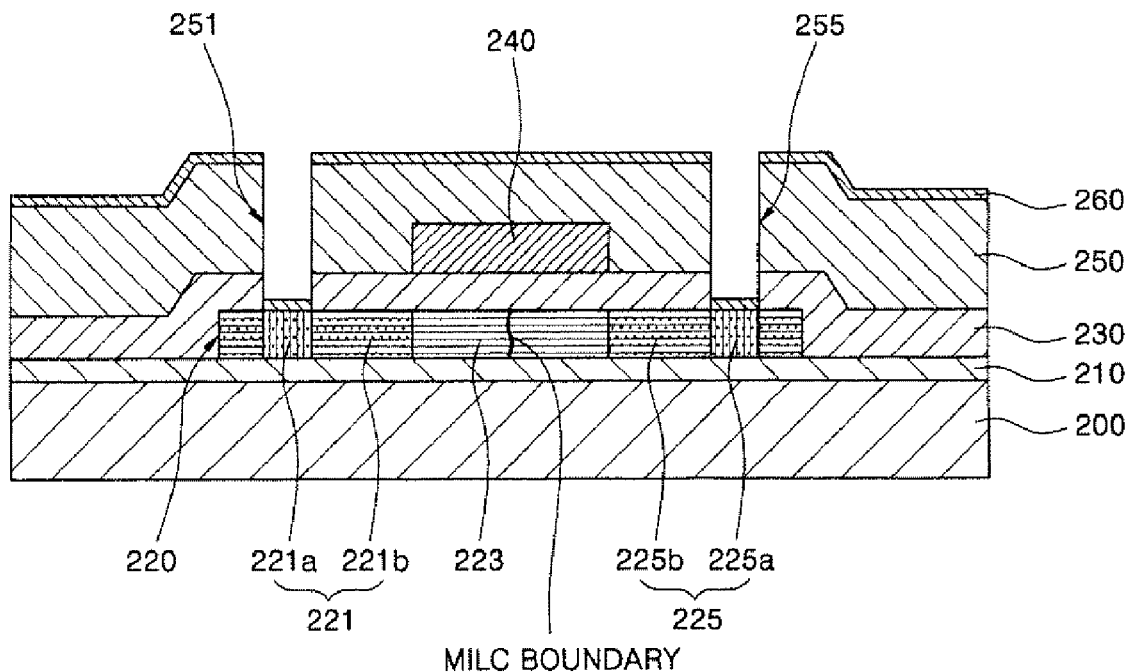
Figure 2D:
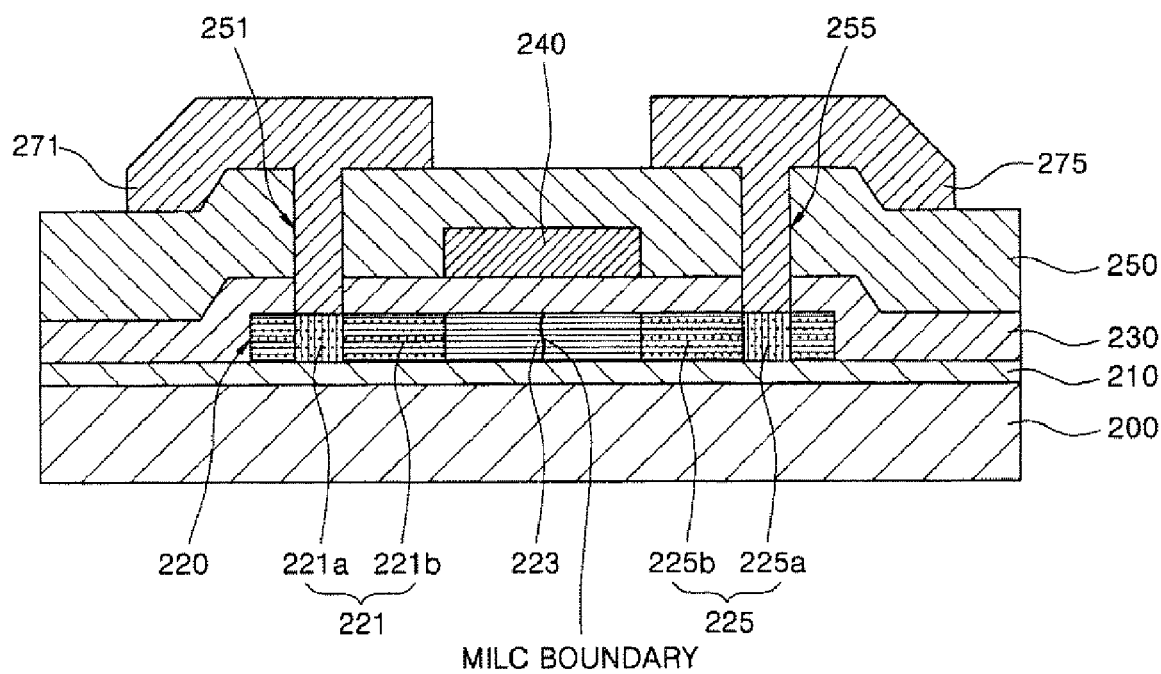

The present invention will now be described with reference to the accompanying drawings, in which exemplary embodiments of the invention are shown. This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art. In the drawings, the thickness of layers and regions are exaggerated for clarity. Like numbers refer to like elements throughout the specification. If an item is described as being formed on another, it may be formed directly thereon or there may be other items therebetween.

First Exemplary Embodiment

FIG. 3 is a plan view showing a TFT in accordance with a first exemplary embodiment of the present invention, which is limited to show an active layer 300 and a gate electrode 330 thereof.

Referring to FIG. 3, contact holes 311 and 315 exposing portions of source/drain regions S and D of an active layer 300, are asymmetrically arranged with each other, and the channel region C is located therebetween. In other words, a distance from the channel region C to the contact hole 311 differs from a distance from the channel region C to the contact hole 315. Additionally, the active layer 300 has a first MILC region and a second MILC region, wherein an MILC surface 320 is positioned outside the channel region C. The first MILC region and the second MILC region are formed by means of two-stage MILC.

FIG. 4A, FIG. 4B, FIG. 4C, FIG. 4D and FIG. 4E are cross-sectional views showing a TFT fabricating method using an MILC process in accordance with a first exemplary embodiment of the present invention.

Figure 5B:
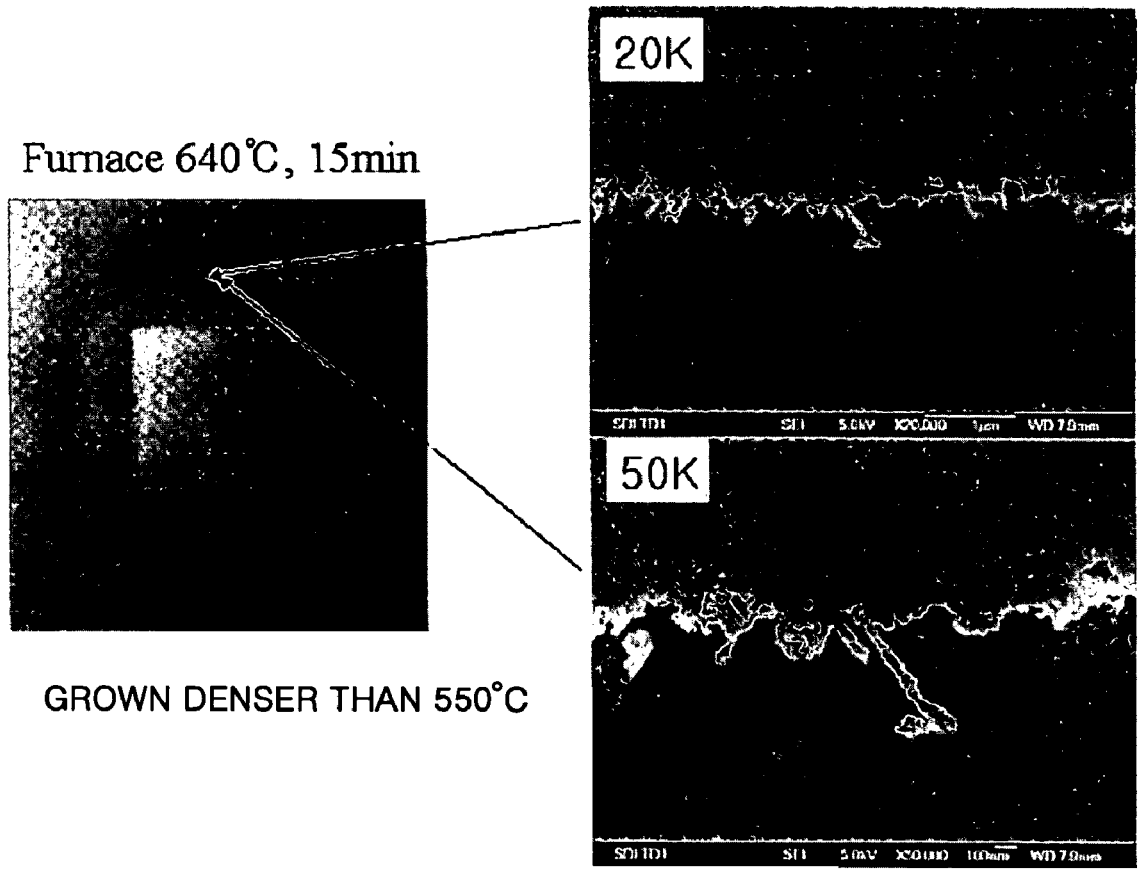

FIG. 5A and FIG. 5B are cross-sectional SEM views of a TFT formed by using an MILC process in accordance with a first exemplary embodiment of the present invention.

Figure 4A:
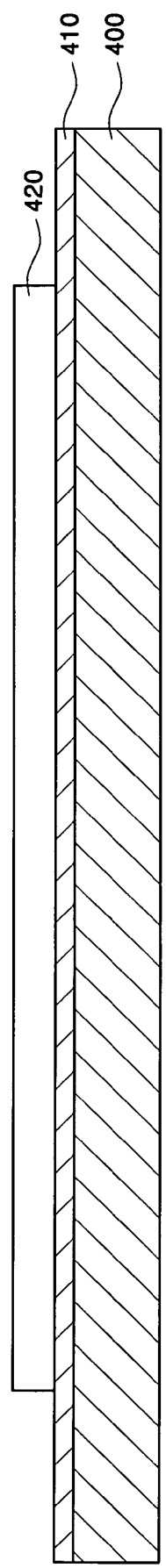
FIG. 4A, FIG. 4B, FIG. 4C, FIG. 4D and FIG. 4E are cross-sectional views showing a method for fabricating a TFT using an MILC process in accordance with a first exemplary embodiment of the present invention.

Referring to FIG. 4A, a buffer layer 410, which is a diffusion barrier, is formed on an insulating substrate 400 to prevent impurities such as metal ions from diffusing from the insulating substrate 400 into an active layer formed of polycrystalline silicon.

Amorphous silicon is then deposited on the buffer layer 410 and patterned to form the amorphous silicon active layer 420.

Figure 4B:
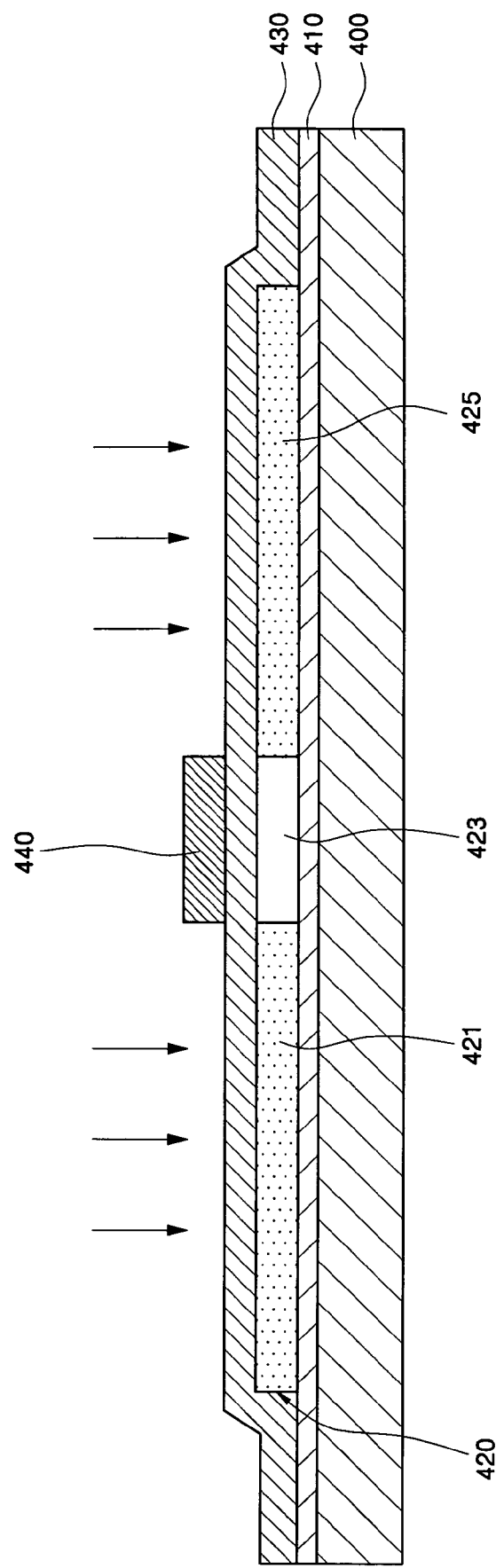

Referring to FIG. 4B, a gate insulating layer 430 and a gate electrode material are sequentially formed on the substrate, and the gate electrode material is patterned to form a gate electrode 440.

Next, impurities are implanted using the gate electrode 440 as a mask to form source/drain regions 421 and 425 in the active layer 420. A region between the source/drain regions 421 and 425 acts as a channel region 423.

Figure 4C:
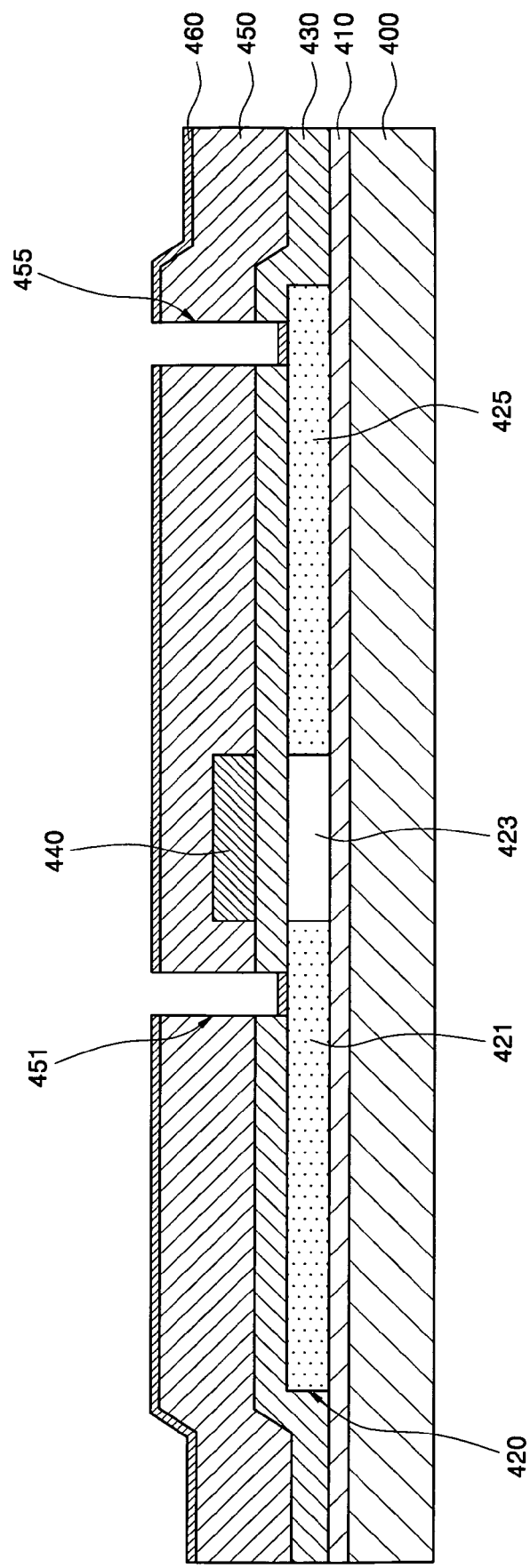

Referring to FIG. 4C, an interlayer insulating layer 450 is then deposited and patterned on the substrate, and contact holes 451 and 455 are formed in the interlayer insulating layer 450 to expose source/drain regions 421 and 425. The contact holes 451 and 455 couple the source/drain regions 421 and 425 to subsequently formed source/drain electrodes, respectively.

In this case, the contact holes 451 and 455 are asymmetrically arranged about the channel region 423. In other words, a distance from the channel region 423 to the contact hole 451 may be shorter than a distance from the channel region 423 to the contact hole 455.

Positioning the contact holes 451 and 455 like as described above adjusts the MIC interface, which is where the MILC starts to occur at both sides of the channel region 423, so as to avoid forming the MILC surface within the channel region in a subsequent MILC process.

Figure 4D:
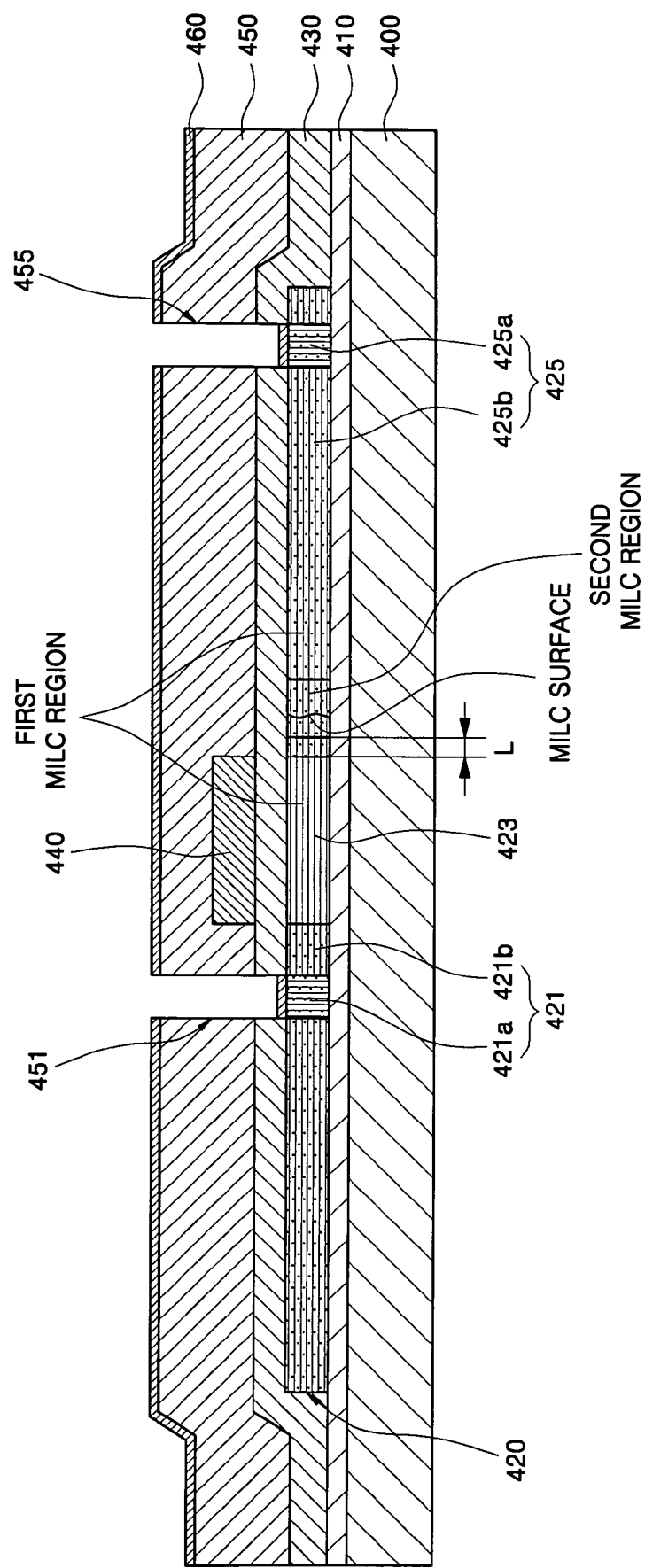

Referring to FIG. 4D, after forming the contact holes 451 and 455, a crystallization inducing metal layer 460, which may be formed of Ni having a thickness of 200 Å, is deposited on the substrate. The crystallization inducing metal layer 460 reacts with the active layer 420 to form a silicide layer during the crystallization process, but it does not react with the interlayer insulating layer 450.

After the crystallization inducing metal layer 460 is deposited, it is heat treated in a furnace to crystallize the active layer 420, thereby forming polycrystalline silicon out of the amorphous silicon.

Crystallization of the amorphous silicon by means of the MILC is performed through a two-stage process, and lower regions 421a and 425a are crystallized by the MIC process, while the remaining regions 421b and 425b of the active layer 420 are crystallized by the MILC process.

A first stage MILC process is performed at a lower temperature than a subsequently performed second stage MILC process, which forms a second MILC region outside of the channel region 423.

In this case, a distance L from the channel region 423 to the second MILC region may be in a range from 0.1 μm to 20 μm, considering a process margin. Since an interface surface between the first MILC region and the second MILC region may act as a trap for blocking the charge transfer of the TFT, the interface surface should not be formed within the channel region 423.

After performing the first stage MILC process, the second stage MILC process is performed at a higher temperature than the first stage MILC process to form the second MILC region in the active layer having the first MILC region, which leads to the MILC surface being formed outside the channel region 423. The second stage MILC process may be performed at a high temperature in a furnace or by a conventional high thermal treatment method, such as Rapid Thermal Annealing (RTA) or other like methods.

The second stage MILC process has a faster crystallization speed than the first stage MILC process, which is performed at a lower temperature. Additionally, as shown in FIGS. 5A and 5B, the first MILC region, crystallized at the lower temperature, may have bigger grains than the second MILC region, which is crystallized at the higher temperature.

Additionally, the active layer 420 is asymmetrically crystallized by means of the asymmetrically formed contact holes 451 and 455, so that the MILC surface is located outside the channel region 423, which prevents the electrical characteristics of the TFT from deteriorating.

Figure 4E:
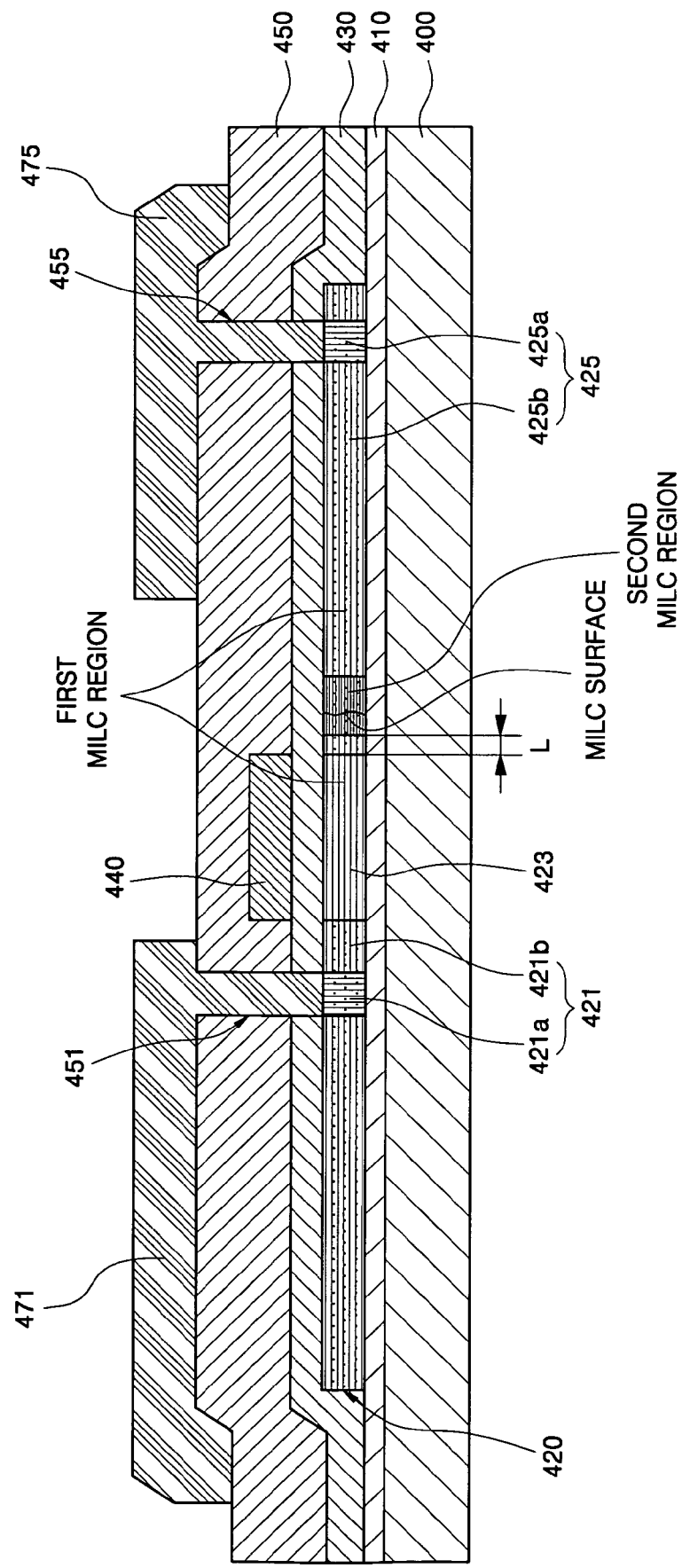

Referring to FIG. 4E, the remaining crystallization inducing metal layer 460 is removed, and a conductive material is deposited and patterned on the substrate to form source/drain electrodes 471 and 475, which completes the TFT for the flat panel display.

The MILC process in the first exemplary embodiment of the present invention is performed through two stages, which consist of the low temperature first stage MILC process and the high temperature second stage MILC process, thereby reducing the MILC process time. In other words, the high temperature second stage MILC process has a faster crystallization speed, which reduces the process time.

Second Exemplary Embodiment

FIG. 6 is a plan view showing a TFT in accordance with a second exemplary embodiment of the present invention, which is limited to show an active layer 500 and a gate electrode 540 thereof.

The TFT formed using the MILC process in accordance with the second exemplary embodiment as shown in FIG. 6 has a similar structure to of the TFT of the first exemplary embodiment except for the arrangement of the contact holes 510 and a crystallization inducing pattern 520, which may be formed in any one of the source/drain regions S and D. In FIG. 6, the crystallization inducing pattern 520 is formed in the source region S between the contact holes 510 and the channel region C, so that the MILC surface 530 is formed outside of the channel region.

Figure 7A:
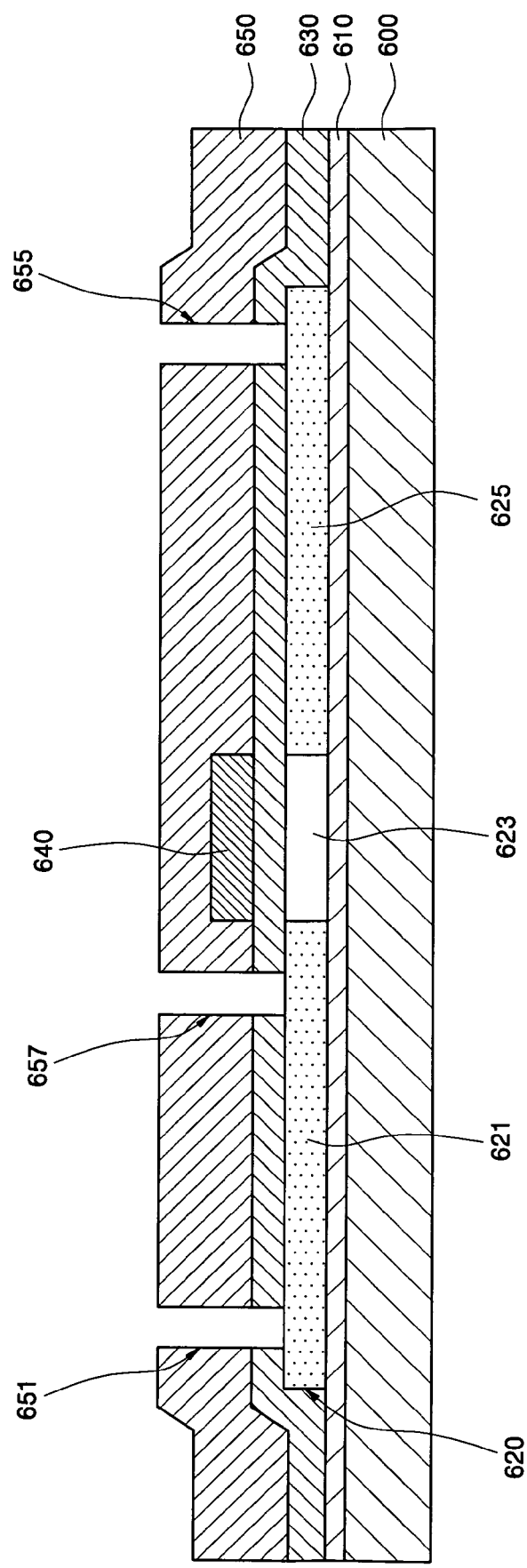
FIG. 7A, FIG. 7B and FIG. 7C are cross-sectional views showing a method for fabricating a TFT formed by using an MILC process in accordance with a second exemplary embodiment of the present invention.
Figure 7B:
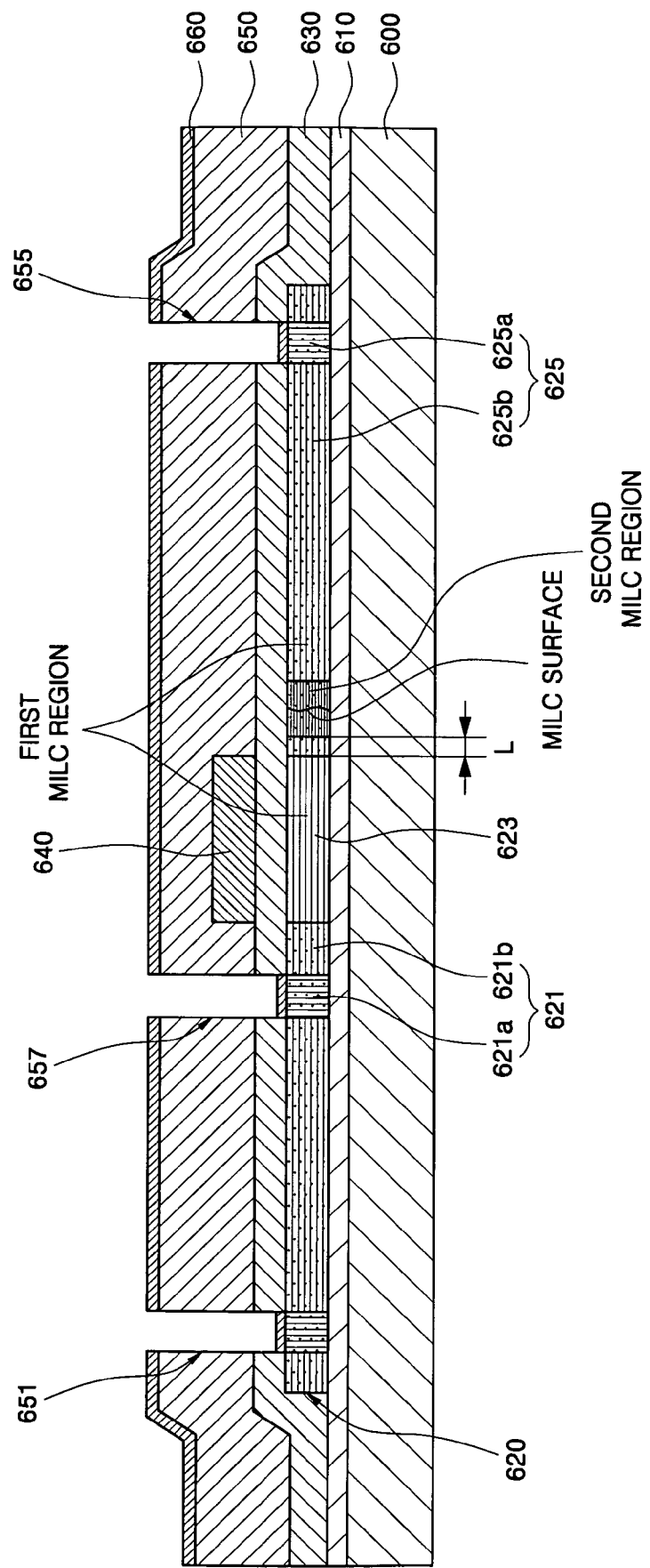
Figure 7C:
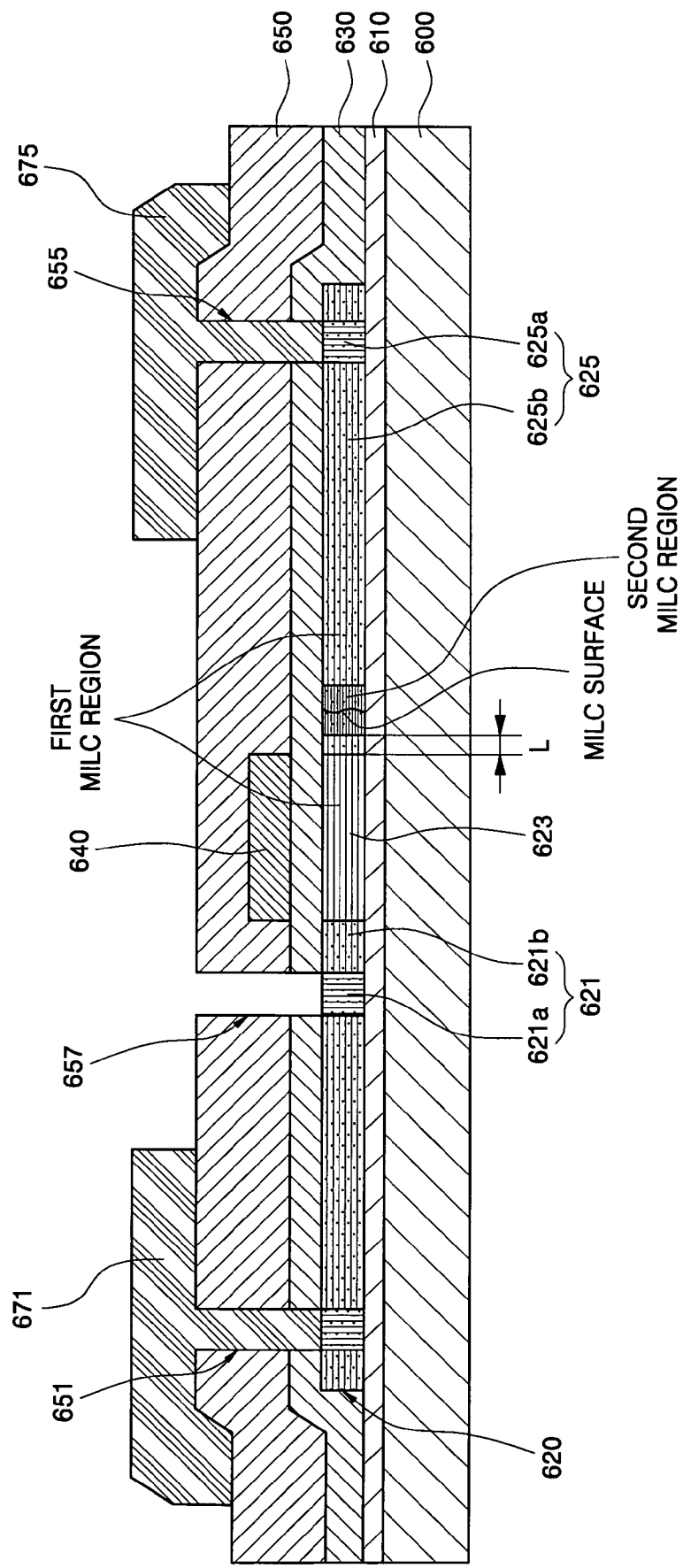

FIG. 7A, FIG. 7B, and FIG. 7C are cross-sectional views showing a TFT fabricating method using an MILC process in accordance with a second exemplary embodiment of the present invention.

Referring to FIG. 7A, as is done in the first exemplary embodiment, a buffer layer 610, an amorphous silicon active layer 620, a gate insulating layer 630, and a gate electrode 640 are sequentially formed on an insulating substrate 600, and impurities are implanted using the gate electrode 640 as a mask to form source/drain regions 621 and 625 in the active layer 620. A region between the source/drain regions 621 and 625 acts as a channel region 623.

An interlayer insulating layer 650 is then deposited and patterned on the substrate to form contact holes 651 and 655 for exposing a portion of the source/drain regions 621 and 625.

In this exemplary embodiment, a crystallization inducing pattern 657 is formed while the contact holes 651 and 655 are formed. A lateral crystallization inducing metal may be deposited in the crystallization inducing pattern 657, which may be formed to expose a portion of any one of the source/drain regions 621 and 625. In FIG. 7A, the crystallization inducing pattern 657 exposes a portion of the source region 621. The crystallization inducing pattern 657 is preferably formed closer to the channel region 623 than to the contact holes 651 and 655.

Similar to the first exemplary embodiment, the MIC interface, which is where the MILC starts to occur at both sides of the channel region 623, should be adjusted to avoid forming the MILC surface within the channel region 623.

Additionally, the crystallization inducing pattern 657 may prevent the unevenness of the MILC due to the contact holes 651 and 655 being smaller than a width of the channel region 623.

Referring to FIG. 7B, after forming the contact holes 651 and 655 and the crystallization inducing pattern 657, a crystallization inducing metal layer 660 of Ni, or other like substances, may be deposited on the substrate.

The crystallization inducing metal layer 660 may be heat treated in a furnace to crystallize the amorphous silicon active layer 620 into polycrystalline silicon.

In this case, the amorphous silicon is crystallized by means a two stage MILC process, as is done in the first exemplary embodiment. Lower regions 621a and 625a, where the metal layer 600 is deposited within the contact holes 651 and 655 and the crystallization inducing pattern 657, are crystallized by the MIC process, and the remaining regions 621b and 625b are crystallized by the MILC process.

In other words, similar to the first exemplary embodiment, the first stage MILC process is performed at a low temperature to form the first MILC region, and the second stage MILC process is performed at a high temperature to form the second MILC region, which is formed outside of the channel region 623.

The distance L from the channel region 623 to the second MILC region may be in a range from 0.1 μm to 20 μm, considering a process margin, which is the same as the first exemplary embodiment.

As shown in FIG. 7B, the MILC surface is formed outside of the channel region 623 by means of the crystallization inducing pattern 657 being formed closer to the channel region 623 than the contact holes 651 and 655.

Referring to FIG. 7C, the remaining crystallization inducing metal layer 660 is removed, and a conductive material is deposited on the substrate and patterned to form source/drain electrodes 671 and 675, which completes the TFT for flat panel display.

In this case, the conductive material that is deposited within the crystallization inducing pattern 657 may be removed by etching when it is patterned.

In other words, the source/drain electrodes 671 and 675 are coupled to the source/drain regions 621 and 625 through the contact holes 651 and 655, but they are not coupled to the source/drain regions 621 and 625 through the crystallization inducing pattern 657.

Third Exemplary Embodiment

Figure 8B:
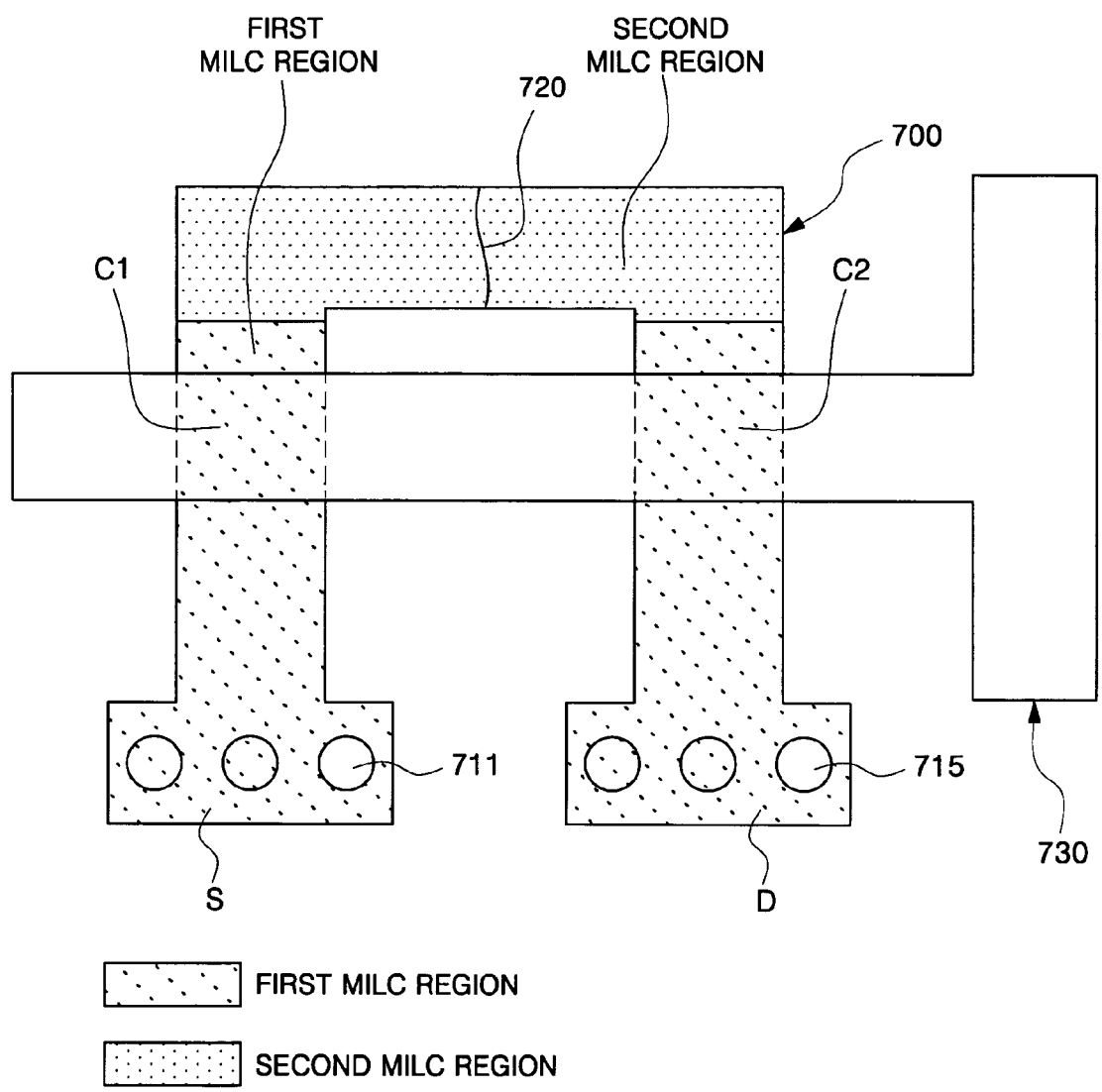

FIG. 8A and FIG. 8B are plan views showing a TFT in accordance with a third exemplary embodiment of the present invention, which is limited to show an active layer 700 and a gate electrode 730 thereof.

As shown in FIG. 8A and FIG. 8B, in the TFT formed by using the MILC process in accordance with the third exemplary embodiment, contact holes 711 and 715 are formed to expose portions of source/drain regions S and D of the active layer 700, and a second MILC region and an MILC surface 720 are formed between two channels $C_1$ and $C_2$.

Figure 9:
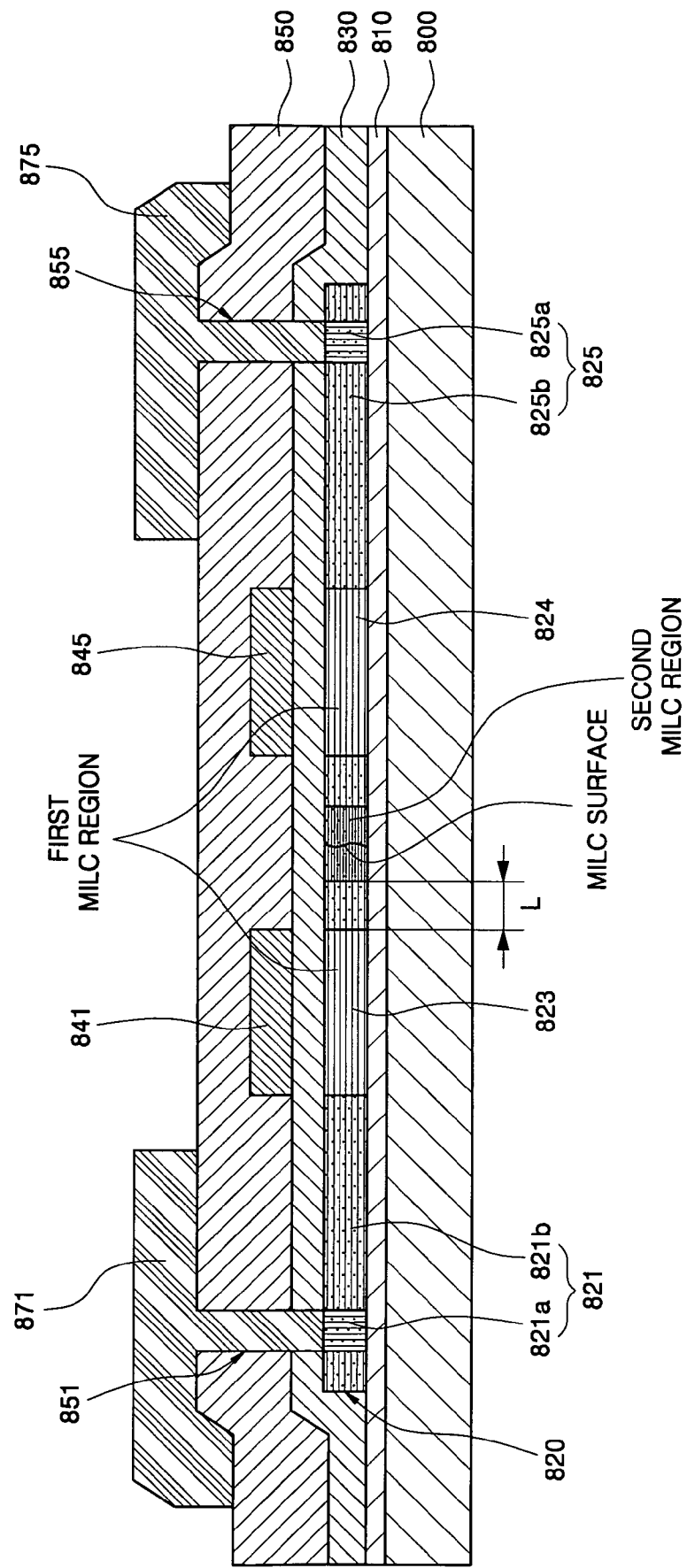
FIG. 9 is a cross-sectional view showing a TFT formed by using an MILC process in accordance with a third exemplary embodiment of the present invention.

FIG. 9 is a cross-sectional view showing a TFT formed by using an MILC process in accordance with a third exemplary embodiment of the present invention.

As shown in FIG. 9, the TFT of the third exemplary embodiment is a dual gate TFT, and it may be fabricated using a process similar to that of the first exemplary embodiment shown in FIG. 4A to FIG. 4E. However, differences in the third exemplary embodiment from the first include patterning the gate electrode material to form two gate electrodes 841 and 845, and the second MILC region and the MILC surface are formed between the two channels 823 and 824, which are below the two gate electrodes when the MILC is performed.

Fourth Exemplary Embodiment

Figure 10A:
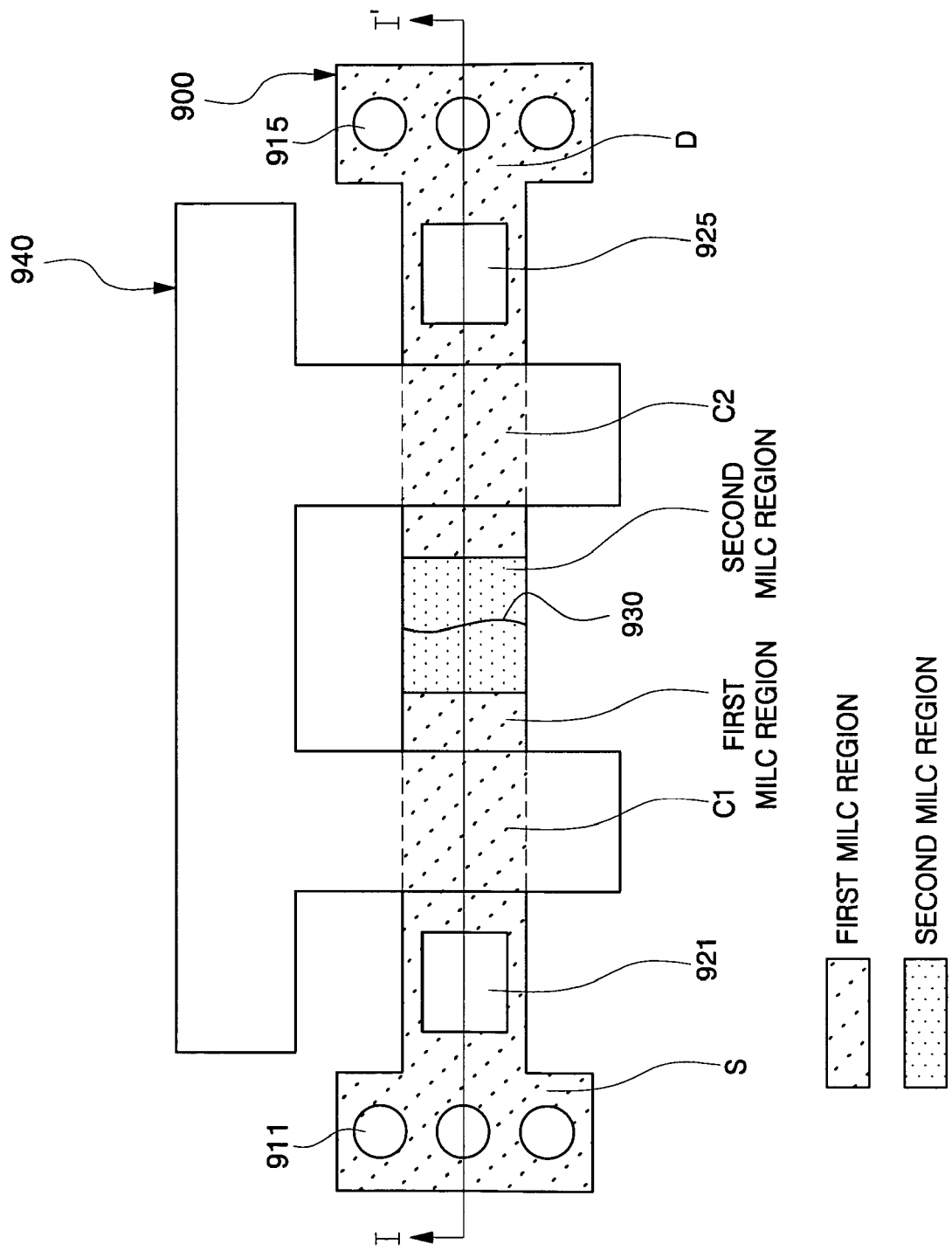
FIG. 10A and FIG. 10B are plan views showing a TFT in accordance with a fourth exemplary embodiment of the present invention.
Figure 10B:
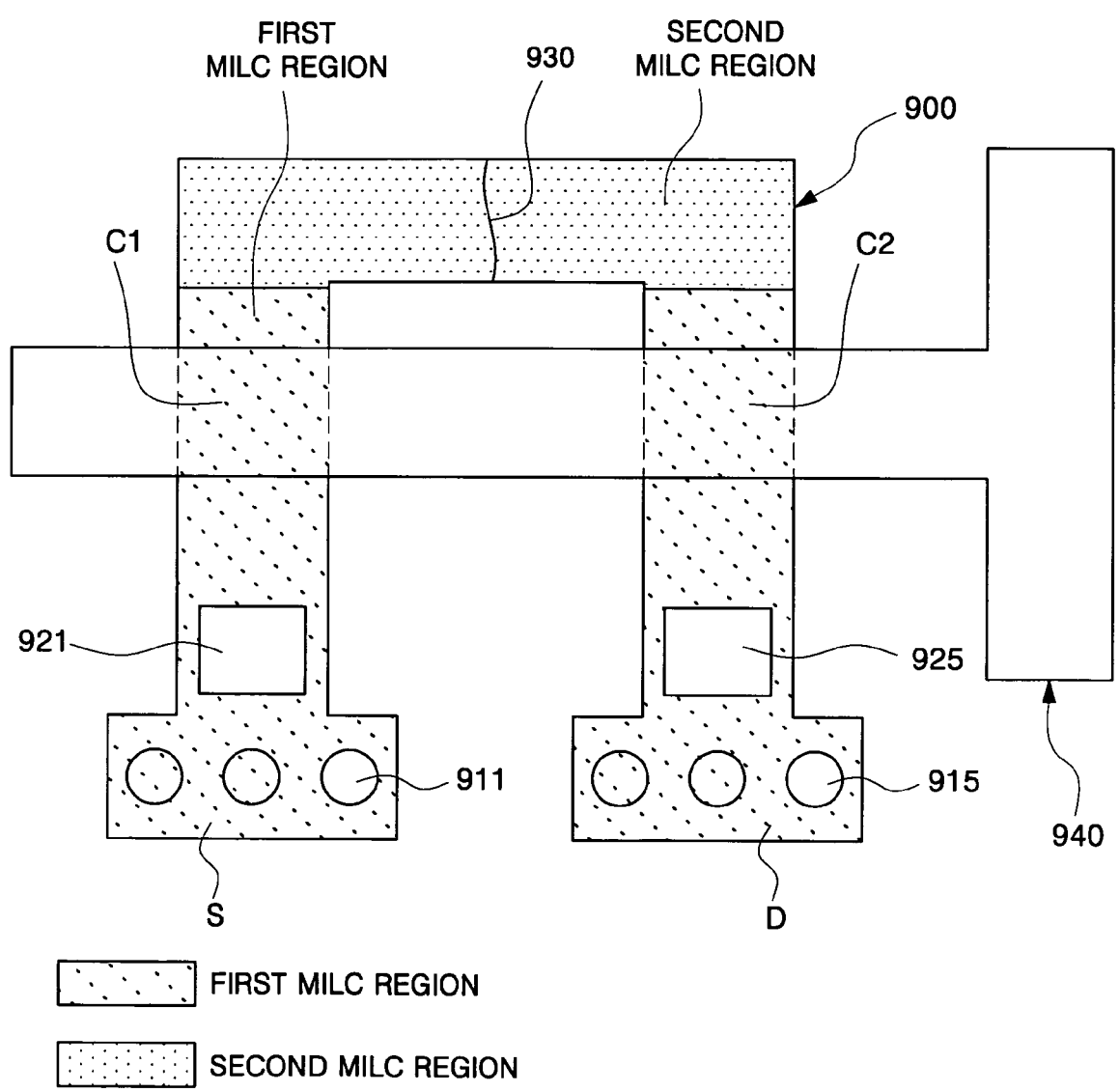

FIG. 10A and FIG. 10B are plan views showing a TFT in accordance with a fourth exemplary embodiment of the present invention, which is limited to show an active layer 900 and a gate electrode 940 thereof.

As shown in FIG. 10A and FIG. 10B, the TFT formed by using the MILC process in accordance with the fourth exemplary embodiment has a structure that is similar to the third exemplary embodiment. However, it differs from the third embodiment in that crystallization inducing patterns 921 and 925 are formed in the source/drain regions S and D, respectively.

In other words, contact holes 911 and 915, which expose portions of the source/drain regions S and D, respectively, and crystallization inducing patterns 921 and 925 are formed, and a second MILC region and an MILC surface 930 are formed between the two channels $C_1$ and $C_2$. In this case, the crystallization inducing patterns 921 and 925 may be formed between the contact holes 911 and 915 and the channel regions $C_1$ and $C_2$, respectively.

Similar to the second exemplary embodiment, the crystallization inducing patterns 921 and 925 may prevent the unevenness of the MILC due to the size of the contact holes 911 and 915 being smaller than a width of the active layer 900.

Figure 11:
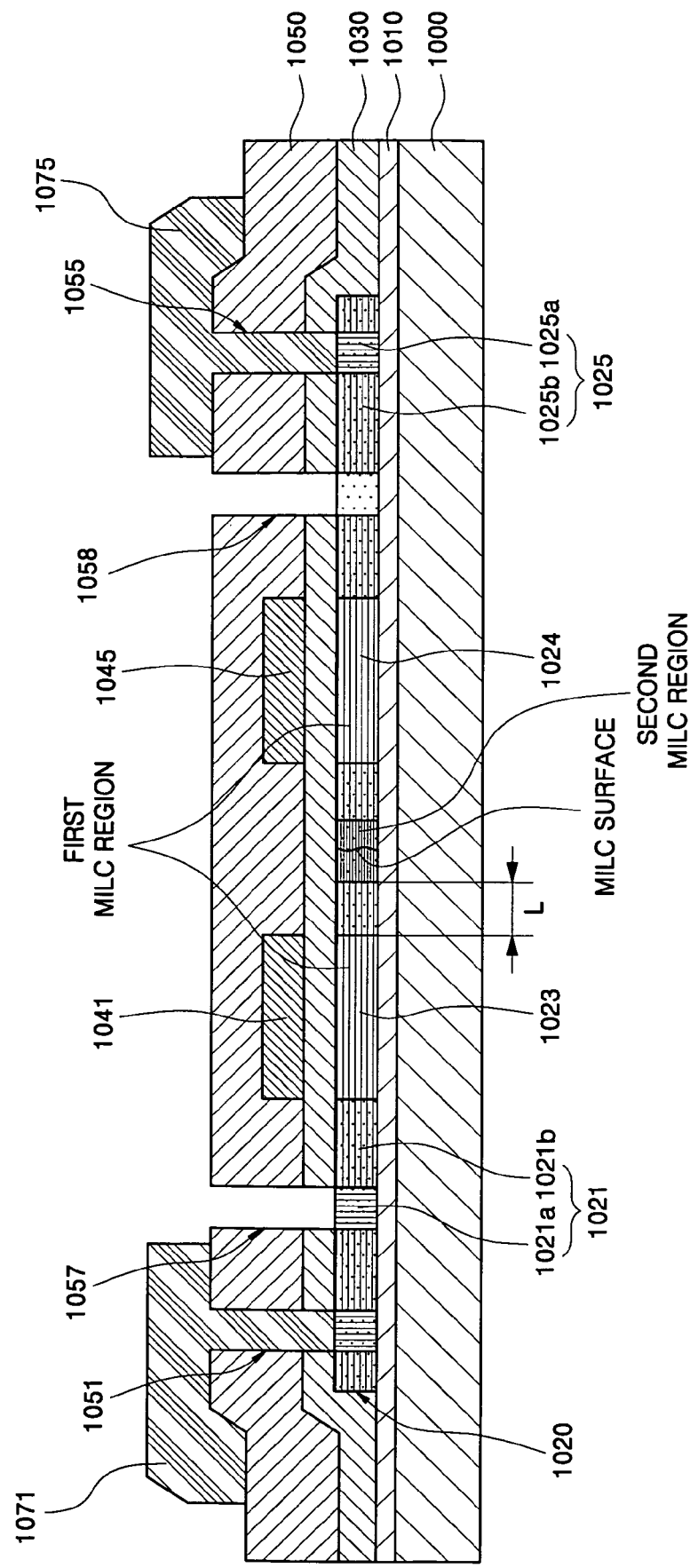
FIG. 11 is a cross-sectional view showing a TFT formed by using an MILC process in accordance with a fourth exemplary embodiment of the present invention.

FIG. 11 is a cross-sectional view showing a TFT formed by using an MILC process in accordance with a fourth exemplary embodiment of the present invention.

As showing in FIG. 11, the TFT of the fourth exemplary embodiment is a dual gate TFT having dual gate electrodes 1041 and 1045, and it may be fabricated using a process similar to that of the second exemplary embodiment. Differences from the second exemplary embodiment include patterning the gate electrode material to form two gate electrodes, two crystallization inducing patterns 1057 and 1058 are formed when contact holes 1051 and 1055 are formed, and the MILC surface is formed between the two channels 1023 and 1024, which are below the two gate electrodes 1041 and 1045 when MILC is performed.

In accordance with the TFT of exemplary embodiments of the present invention, the MILC surface is formed outside the channel region to prevent the TFT's electrical characteristics from deteriorating.

Additionally, the TFT has been shown and described using two MILC regions, which have grain sizes different from each other, in the active layer. However, the TFT's active layer may have three or more MILC regions, which have grain sizes that are different from each other.

In accordance with exemplary embodiments of the present invention as described above, the MILC process may be performed through two stages of low and high temperatures to provide the TFT having the active layer with multiple regions having grain sizes different from each other.

Furthermore, by performing the MILC process through the two stages of low and high temperatures, the time required to fabricate the TFT may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. A thin film transistor (TFT), comprising:
an active layer formed of polycrystalline silicon;
a source region in the active layer;
a drain region in the active layer;
a channel region in the active layer; and
a gate electrode,
wherein the active layer has at least two metal induced lateral crystallization (MILC) regions, the at least two MILC regions comprise a first MILC region and a second MILC region, the second MILC region is arranged between portions of the first MILC region, and the polycrystalline silicon of the second MILC region and the polycrystalline silicon of the first MILC region have different physical characteristics from each other, wherein the channel region and one of the drain region and the source region include the first MILC region but not the second MILC region, and wherein a grain size of the first MILC region is bigger than a grain size of the second MILC region.

2. The TFT of claim 1, wherein an MILC surface is formed outside the channel region.

3. The TFT of claim 1, wherein the MILC regions have different grain sizes.

4. The TFT of claim 1, wherein the active layer has only the first MILC region and the second MILC region.

5. The TFT of claim 4, wherein a distance from the channel region to the second MILC region is in a range from 0.1 μm to 20 μm.

6. The TFT of claim 2, wherein the active layer has only the first MILC region and the second MILC region.

7. The TFT of claim 6, wherein a distance from the channel region to the second MILC region is in a range from 0.1 μm to 20 μm.

8. A thin film transistor (TFT), comprising:
an active layer, comprising:
a source region,
a drain region,
a channel region, and
a first MILC region and a second MILC region; and
a gate electrode,
wherein portions of the source region and the drain region are exposed by contact holes;
wherein a distance from a contact hole of the source region to the channel region is different from a distance from a contact hole of the drain region to the channel region;
wherein a grain size of the first MILC region and a grain size of the second MILC region are different;
wherein the channel region and one of the drain region and the source region include the first MILC region but not the second MILC region; and
wherein a grain size of the first MILC region is bigger than a grain size of the second MILC region.

9. The TFT of claim 8, wherein an MILC surface is formed outside the channel region.

10. The TFT of claim 8, wherein a distance from the channel region to the second MILC region is in a range from 0.1 μm to 20 μm.

11. The TFT of claim 9, wherein a distance from the channel region to the second MILC region is in a range from 0.1 μm to 20 μm.

12. A thin film transistor (TFT), comprising:
an active layer crystallized by an MILC process and having a source region, a drain region and a channel region;
a gate electrode;
a source electrode coupled to the source region through a first contact hole; and
a drain electrode coupled to the drain region through a second contact hole; and
a crystallization inducing pattern exposing a portion of the active layer in the source region or the drain region,
wherein the crystallization inducing pattern does not electrically connect the source region to the source electrode or the drain region to the drain electrode;
wherein the active layer has a first MILC region and a second MILC region; and
wherein a grain size of the first MILC region is different from a grain size of the second MILC region;
wherein the channel region and one of the drain region and the source region include the first MILC region but not the second MILC region; and
wherein a grain size of the first MILC region is bigger than a grain size of the second MILC region.

13. The TFT of claim 12, wherein an MILC surface is formed outside the channel region.

14. The TFT of claim 12, wherein a distance from the channel region to the second MILC region is in a range from 0.1 μm to 20 μm.

15. The TFT of claim 12,
wherein the crystallization inducing pattern is formed closer to the channel region than to the first contact hole and the second contact hole; and
wherein an area where the active layer is exposed by the crystallization inducing pattern is larger than an area where the active layer is exposed by a contact hole.

16. The TFT of claim 13, wherein a distance from the channel region to the second MILC region is in a range from 0.1 μm to 20 μm.

17. A thin film transistor (TFT), comprising:
an active layer crystallized by an MILC process and having a source region, a drain region and a channel region; and
a dual gate electrode,
wherein portions of the source region and the drain region are exposed by contact holes;
wherein the active layer has a first MILC region and a second MILC region;
wherein a grain size of the first MILC region is different from a grain size of the second MILC region;
wherein the channel region and one of the drain region and the source region include the first MILC region but not the second MILC region; and
wherein the grain size of the first MILC region is bigger than the grain size of the second MILC region.

18. The TFT of claim 17, wherein an MILC surface is formed outside the channel region.

19. The TFT of claim 17, wherein a distance from the channel region to the second MILC region is in a range from 0.1 μm to 20 μm.

20. The TFT of claim 18, wherein a distance from the channel region to the second MILC region is in a range from 0.1 μm to 20 μm.

21. A thin film transistor (TFT), comprising:
an active layer, comprising:
a source region,
a drain region,
a channel region, and
a first MILC region and a second MILC region;
a dual gate electrode;
a source electrode coupled to the source region by a first contact hole;
a drain electrode coupled to the drain region by a second contact hole; and
a crystallization inducing pattern exposing a portion of the active layer between the first contact hole or the second contact hole and the channel region;
wherein the crystallization inducing pattern does not electrically connect the source region to the source electrode or the drain region to the drain electrode;
wherein a grain size of the first MILC region is different from a grain size of the second MILC region,
wherein the channel region and one of the drain region and the source region include the first MILC region but not the second MILC region, and
wherein a grain size of the first MILC region is bigger than a grain size of the second MILC region.

22. The TFT of claim 21, wherein an MILC surface is formed outside the channel region.

23. The TFT of claim 21, wherein a distance from the channel region to the second MILC region is in a range from 0.1 µm to 20 µm.

24. The TFT of claim 21,
wherein the crystallization inducing pattern is formed closer to the channel region than to the first contact hole and the second contact hole; and
wherein an area where the active layer is exposed by the crystallization inducing pattern is larger than an area where the active layer is exposed by a contact hole.

25. The TFT of claim 22, wherein a distance from the channel region to the second MILC region is in a range from 0.1 µm to 20 µm.

* * * * *